United States Patent [19]

Rumennik

[11] 4,409,607
[45] Oct. 11, 1983

[54] NORMALLY-ON ENHANCEMENT MODE MOSFET WITH NEGATIVE THRESHOLD GATING

[75] Inventor: Vladimir Rumennik, Playa Del Rey, Calif.

[73] Assignee: Xerox Corporation, Stamford, Conn.

[21] Appl. No.: 172,338

[22] Filed: Jul. 25, 1980

[51] Int. Cl.³ .............. H01L 27/02; H01L 29/12; H01L 29/78
[52] U.S. Cl. ............................ 357/23; 357/41; 357/58
[58] Field of Search ............ 357/23 R, 23 VD, 58, 357/23 D, 23 VT, 41

[56] References Cited

U.S. PATENT DOCUMENTS

3,996,655 12/1976 Cunningham et al. ....... 357/23 VD
4,081,817 3/1978 Hara ................................ 357/23 R
4,242,691 12/1980 Kotani et al. ..................... 357/58 X Primary Examiner—James W. Davie
Assistant Examiner—J. Carroll

[57] ABSTRACT

A VLSI enhancement mode metal oxide semiconductor field effect transistor operative to be Normally-On except during those periods when a negative threshold voltage is applied to the gate electrode. A submicron MOSFET channel having relatively high resistivity substrate allows for source and drain PN junction with overlapping depletion regions to create an electric field that promotes a surface inversion layer in the channel for conduction between the source and drain in a Normally-On mode except upon application of a negative gate threshold that acts to invert the channel surface to a non-conducting mode.

1 Claim, 12 Drawing Figures

FIG. 5

NORMALLY-ON ENHANCEMENT MODE MOSFET WITH NEGATIVE THRESHOLD GATING

BACKGROUND OF THE INVENTION

The invention relates generally to MOSFET's and specifically Normaly On enhancement mode MOSFET's.

SUMMARY OF THE INVENTION

Accordingly, it is an object of the present invention is to provide a Normally-On enhancement mode MOSFET having a negative threshold voltage, A further object of the invention is to provide the Normally-On enhancement mode MOSFET with a channel which does not necessarily require any special doping or implanting in the channel area.

Yet another object of the invention is to provide the Normally-On enhancement mode MOSFET that is VLSI in spatial dimensions.

Yet another further object of the invention is to provide the Normally-On enhancement mode MOSFET with a relatively very high resistivity substrate.

Another object of the invention is to provide the Normally-On enhancement mode MOSFET as a NMOS type.

Another further object of the invention is to provide the Normally-On enhancement mode MOSFET as a DMOS type.

Another but yet further object of the invention is to provide the Normally-On enhancement mode MOSFET as a VMOS type.

BRIEF DESCRIPTION OF THE DRAWINGS

Various other objects, advantages and features of the invention will become more fully apparent from the following specification, supported claims and accompanying drawing sheets.

The features of a specific embodiment of the invention are illustrated in the drawings in which.

DESCRIPTION OF THE PREFERRED EMBODIMENT

Figure 1:
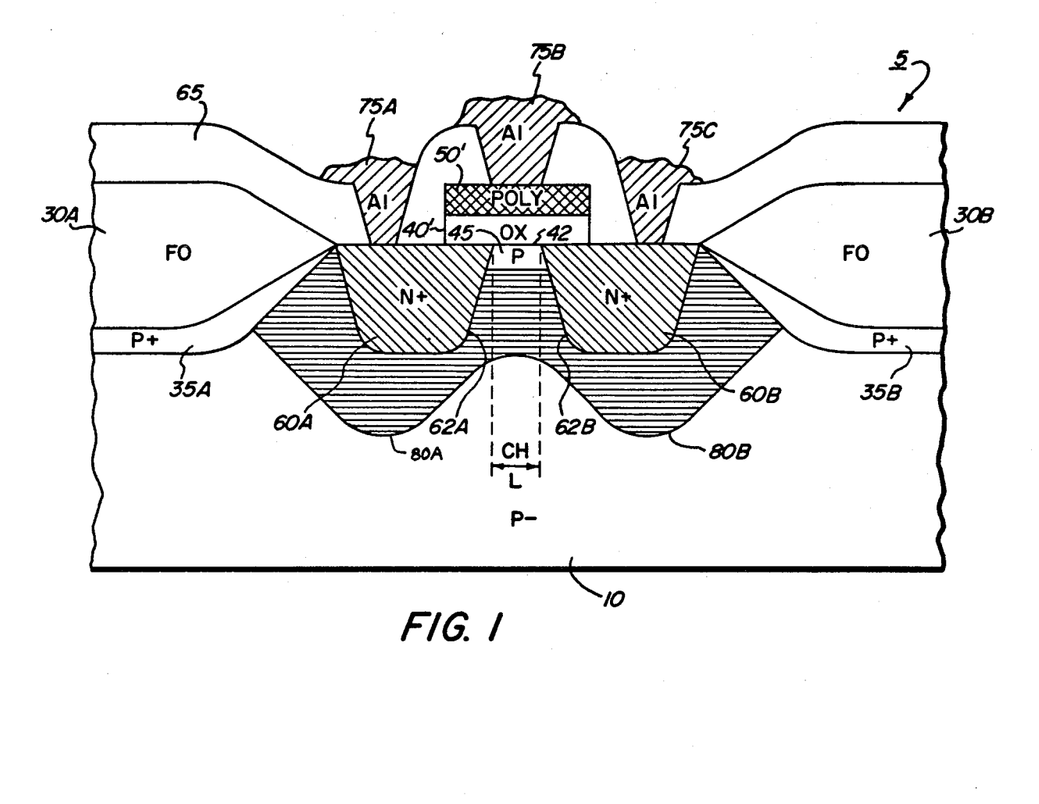
FIG. 1 is a profile of the structure of the Normally-On enhancement mode NMOS MOSFET of the present invention.

The structure of the Normally-On enhancement MOSFET device as a NMOS type is shown in FIG. 1 and includes N plus drain and source regions 60A and 60B, channel area 45 having length (L), gate oxide or insulation area 40', polysilicon or conductive gate area 50', field oxide barriers 30A and 30B, inversion barrier plus areas 35A and 35B, device insulation oxide layer 65, an Aluminum electrodes 75A and C, and a P minus substrate 10.

Because the channel P area 45 length (L) is spatially approximately equal to or less than a micron or submicron dimension, the depletion regions (or layers) 80A and 80B for the P-N junctions of the source and drain regions 60A and 60B relatively overlap under the gate oxide 40' and particularily in the P channel area 45. In effect, the built-in potentials of the source and drain P-N junctions (62A-B), when the depletion regions 60A and 60B are overlapped creates a relatively high electric field on the surface of the P channel area 45 under the gate oxide 40' that acts to invert the surface area of the P channel area 45 as an inversion layer 42 to effectively give a conducting channel under the gate oxide 40' as between the source and drain regions 60A and B even when no drain voltage is applied at electrode 75C, and thus will be on even when no negative threshold voltage at electrode 75B is applied. When the drain voltage at electrode 75B is increasingly applied, voltage potential as between the source and drain areas 60 A and B will also proportionally increase. It is very important to note that at any time a point there-between that a negative threshold voltage, as applied to the gate electrode 75B, may be used to turn-off the Normally-On devices or propotionally limit conduction as between the source and drain regions 60A and B by again inverting the surface of the P channel 45 to be effectively an N channel thereby obviating conduction therethrough. It will be appreciated that P doping channel 45 is not critical to the present invention.

It will be particularly appreciated that the above Normally-On effect which requires a negative threshold gate voltage for turn-off in the present invention is most pronounced when the P channel area 45 length (L) is spatially approximately equal to or less than a micron (submicron in dimension which approximates VLSI dimensions, but may be greater when a proportionally decremented effect is desired. Likewise, the effect is most pronounced when substrate resistivity is at least 300 ohms centimeter which approximates a very pure substrate, but may be less when a proportionally decremented effect is desired. Such ultrapure substrate have only been relatively recently used on a volume basis in high voltage environments. In addition to the above, parameters that act on or promote the above effect to some degree involve the varying of the N plus doping for the source and drain regions 60A and 60B., and also to an even lesser degree, the P doping of channel 45.

Generically, the present invention finds its broadest application in MOS or MOSFET structures, with a exemplary species NMOS having particularly broad application. Other species for which the present invention could be practical include VMOS, and DMOS. The processes for NMOS will be described in detail in conjunction with fabricating the present invention.

In a controllable process for fabricating the Normally-On enhancement mode NMOS type MOSFET, there are eight major steps in the preferred embodiment. It will be appreciated that either N-type or P-type logic may be used to obtain the desired result in the present invention. It will be further appreciated that the dimensions and tolerances used in the present invention are exemplary unless otherwise noted and may be modified within reasonable limits without detracting from the present invention. The above described major steps are shown in FIGS. 2A to 2H respectively.

Figure 2A:
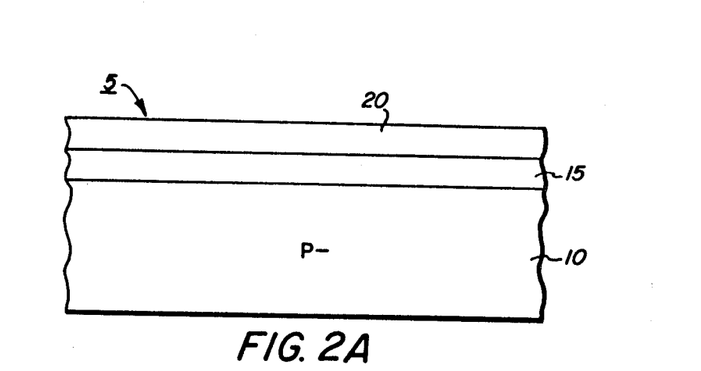
FIG. 2A is a profile of the first step of the process for fabricating the Normally-On enhancement mode NMOS MOSFET of FIG. 1.

In the first major process step for the NMOS MOSFET as shown in FIG. 2A, having multiple substeps, a silicon (Si) substrate 10 that is slightly P minus (−) doped is operative to have a initial silicon dioxide ($SiO_2$) layer 15 of approximately 400 Angstrom, is thermally formed or grown to the predetermined depth on the surface of the substrate 10. A layer 20 of Silicon Nitride ($Si_3N_4$) of approximately 1000 angstroms is next deposited to a predetermined depth over the $SiO_2$ layer 15 by use of chemical vapor deposition (CVD).

Figure 2B:
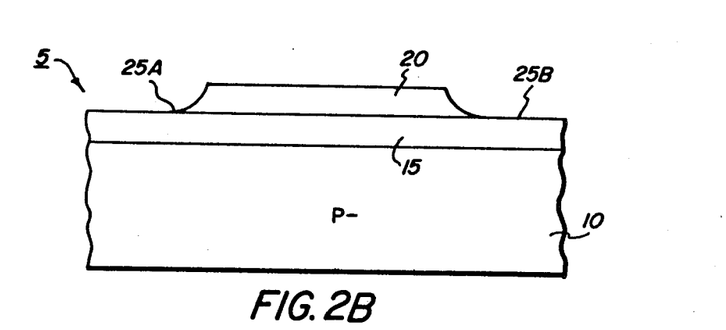
FIG. 2B is a profile of the second step of the process for fabricating the Normally-On enhancement mode NMOS MOSFET of FIG. 1.

As a second major step in the process for creating a NMOS type MOSFET device having multiple substeps as shown in FIG. 2B, selective nitride etching through a photolithographic subprocess (photoresist layer, mask, exposed with UV) for predetermined removal of part of the $Si_3N_4$ layer 20 to thus leave the windows 25A and 25B exposed to the surface of the $SiO_2$ layer 15. A P plus (+) type impurity such as Boren B is introduced in windows 25A and B by implanting as a field inversion stopper at 35A and B. The remaining photoresist layer is then removed (not shown).

Figure 2C:
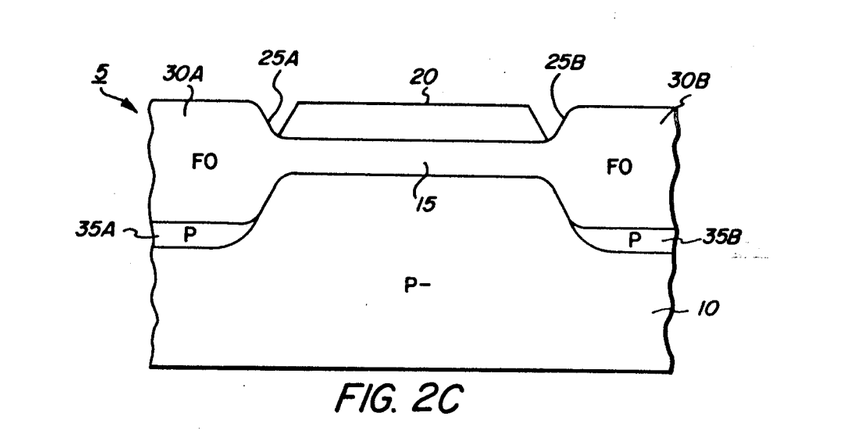
FIG. 2C is a profile of the third step of the process for fabricating the Normally-On enhancement mode NMOS MOSFET of FIG. 1.

As a third major step in the process for creating a NMOS type MOSFET device having multiple substeps as shown in FIG. 2C, a field oxide (FO) of $SiO_2$ is thermally formed or grown in window 25A and B insomuch as the $SiO_2$ layer reacts with the oxygen atmosphere where so exposed and with the substrate 10 itself to form FO areas 30A and 30B of one micron to a predetermined height above the layer 15 and a predetermined depth below the layer 15 so that the FO areas 30A and 30B are relatively higher than they are deeper with respect to the layer 15. Layer 20 is pitched away or removed with an acid or reactive plasma etching.

Figure 2D:
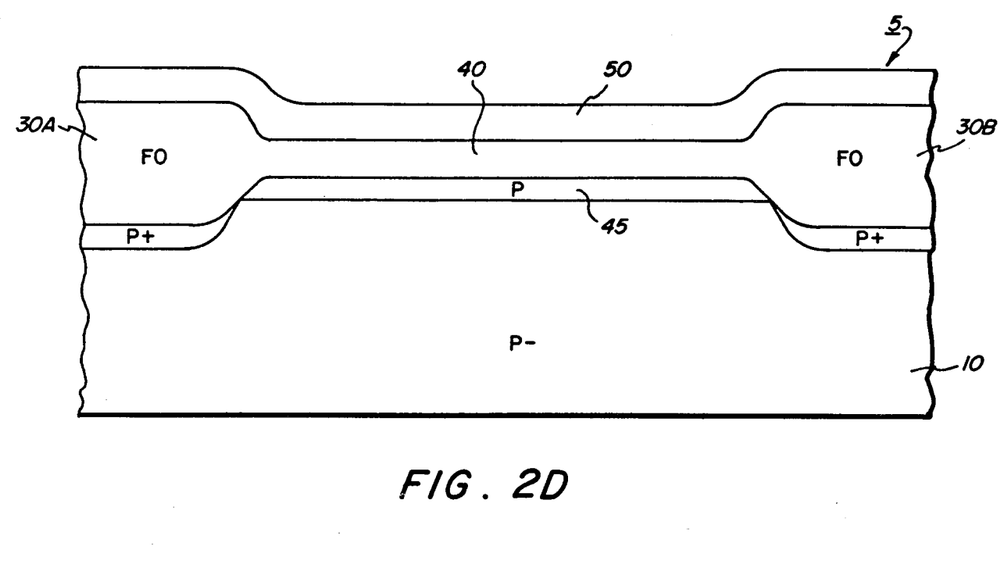
FIG. 2D is a profile of the fourth step of the process for fabricating the Normally-On enhancement mode NMOS MOSFET of FIG. 1.

As a fourth major step in the process for creating a NMOS type MOSFET device having multiple substeps as shown in FIG. 2D, the remaining nitride layer 20 and initial oxide layer 15 are etched away or otherwise removed with an acid or reactive solution down to the surface of the substrate 10. Next, a new oxide layer 40 is thermally grown to a predetermined depth on the surface of the substrate 10. An ion implant is made through the new oxide layer 40 into the surface of the substrate 10 to a predetermined depth as a P conductivity type implant area 45 with Boron B for the channel as an enhancement mode transistor implant for threshold voltage adjustment. Next, polysilicon is deposited as a layer 50 over the new oxide layer 40.

Figure 2E:
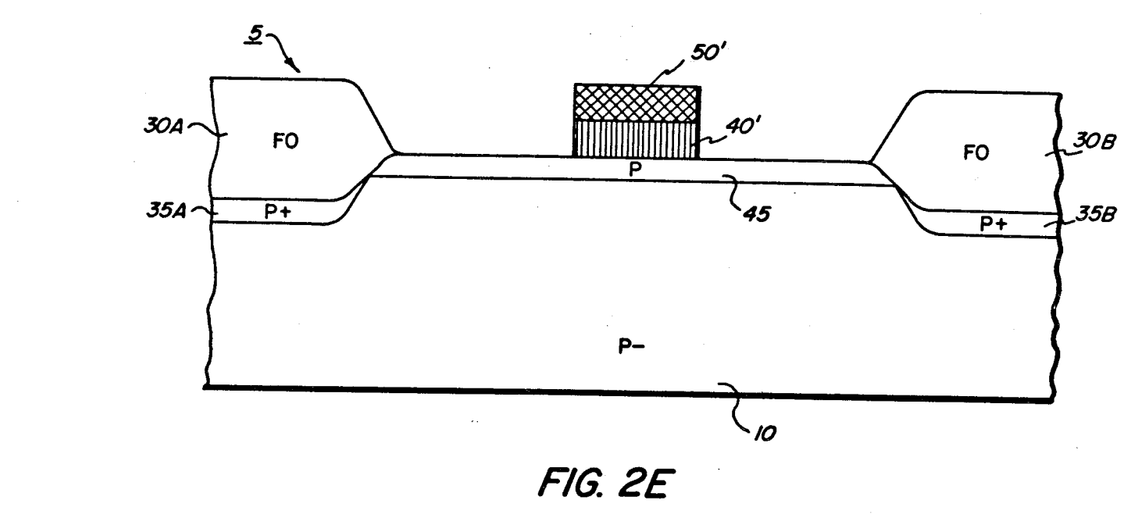
FIG. 2E is a profile of the fifth step of the process for fabricating the Normally-On enhancement mode NMOS MOSFET of FIG. 1.

As a fifth major step in the process for creating a NMOS type MOSFET device having multiple substeps as shown in FIG. 2E, a photolithographic subprocess is used including applying a photoresist layer, masking, applying UV, and etching away of the exposed areas of layer 40 and 50 leaving unexposed areas including the gate oxide 40' of 700 Angstroms and superimposed thereon the polysilicon gate 50'. The remaining photoresist is removed.

Figure 2F:
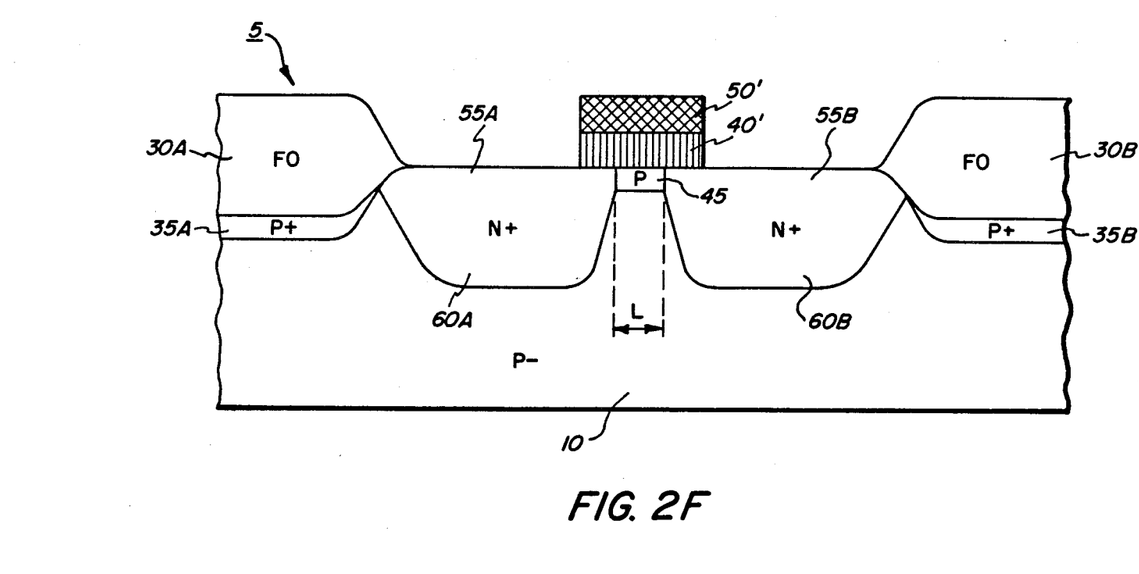
FIG. 2F is a profile of the sixth step of the process for fabricating the Normally-On enhancement mode NMOS MOSFET of FIG. 1.

As a sixth major step in the process for creating a NMOS type MOSFET device having multiple substeps as shown in FIG. 2F, an ion implant is made into the exposed areas 55A and B of the substrate 10 using a predetermined concentration of arsenic (As) to give N(+) Plus doped source or drain regions 60B and 60A respectively. In the present invention, the channel length (L) as between the implanted source and drain regions will be approximately equal to or less than a micron in length (submicron).

Figure 2G:
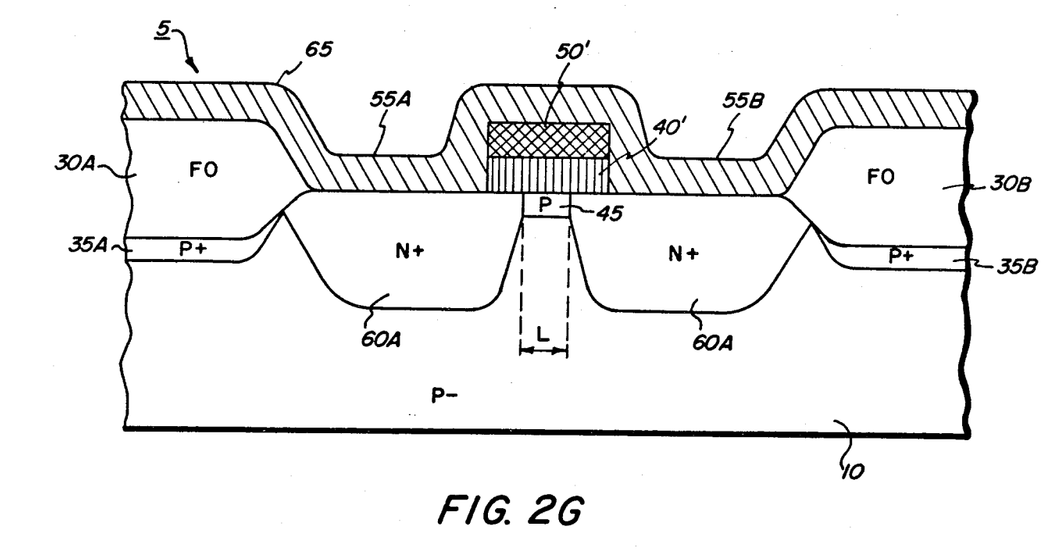
FIG. 2G is a profile of the seventh step of the process for fabricating the Normally-On enhancement mode NMOS MOSFET of FIG. 1.

As a seventh major step in the process for creating a NMOS device having multiple substeps as shown in FIG. 2G, an insulator or oxide is deposited as a layer 65 over the entire surface of the devices to a predetermined depth.

Figure 2H:
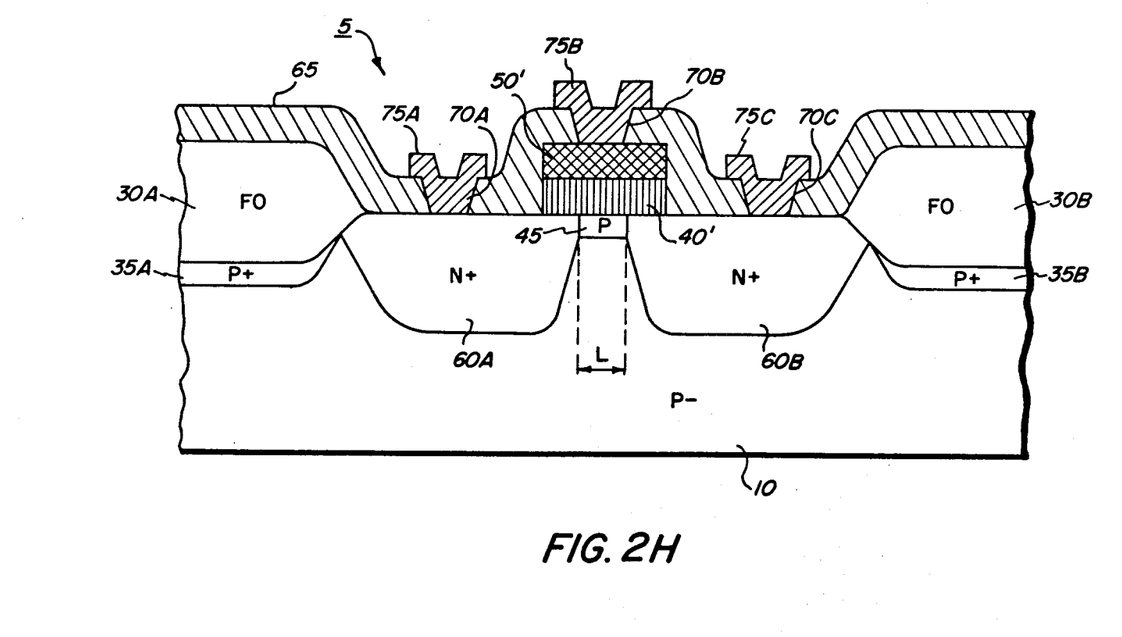
FIG. 2H is a profile of the eighth step of the process for fabricating the Normally-On enhancement mode NMOS MOSFET of FIG. 1.

As an eighth major step in the process for creating a NMOS device having multiple substeps as shown in FIG. 2H, a photolithographic subprocess is used including applying a photoresist layer, masking, applying UV, and etching away of the exposed areas including windows for drain, gate, and source 70 A,B, and C, respectively. The remaining photoresist is removed. Next, a layer of conductive material for an electrode such as Aluminum (Al) is applied uniformly over the surface of the devices to a predetermined depth. A second photolithographic subprocess is used including applying a photoresist layer, masking, applying UV, and etching away of exposed areas leaving unexposed areas as drain gate, and source electrode 75A, B, and C. The remaining photoresist is removed.

Figure 3:
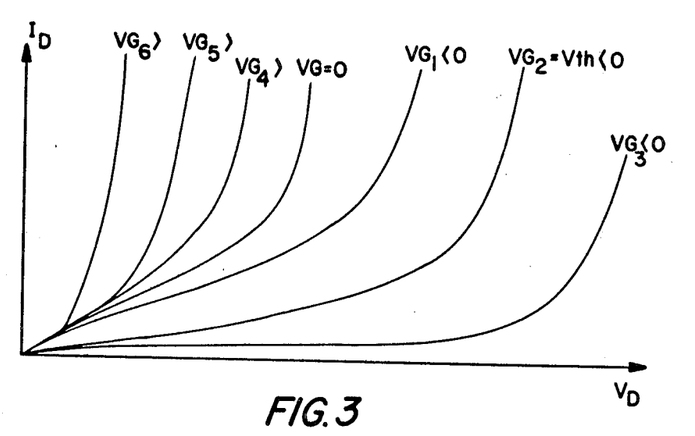
FIG. 3 is a curve for drain current plotted against drain voltage for the Normally-On enhancement mode NMOS MOSFET of FIG. 1.
Figure 4:
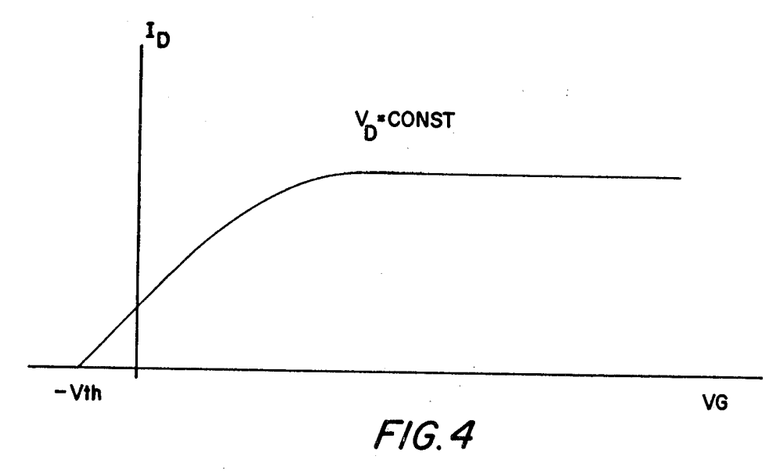
FIG. 4 is a curve for drain current plotted against gate voltage for the Normally-On enhancement mode NMOS MOSFET of FIG. 1.
Figure 5:
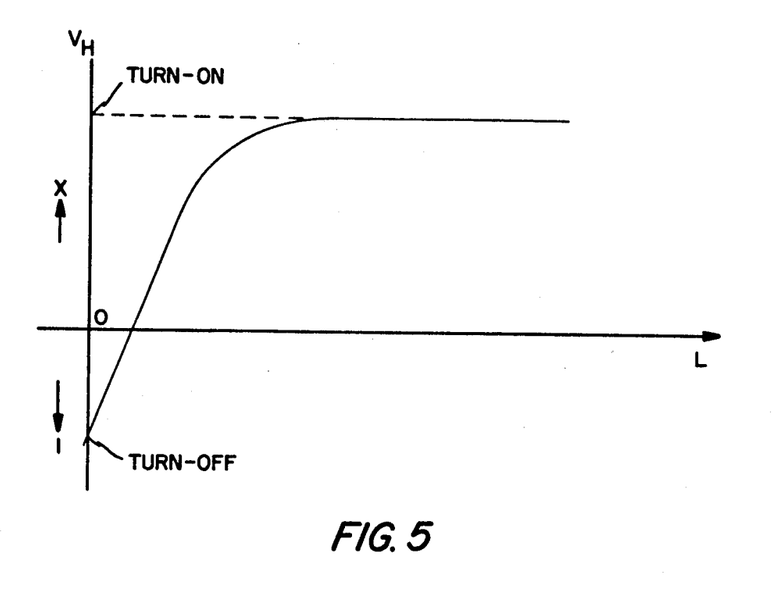
FIG. 5 is a curve for threshold voltage plotted against channel length for the Normally-On enhance mode NMOS MOSFET of FIG. 1.

The voltage current curves for the devices of the present invention include FIG. 3 which shows the drain voltage as the independent variable plotted against the dependent drain current of various constant gate voltages. In FIG. 4, the indepth variable gate voltage is plotted against the dependent variable drain current of a constant drain voltage. The negative threshold gate voltages in FIG. 4 will be particularly be noted. In FIG. 5, the independent variable channel length (L) is plotted against the dependent variable threshold voltage showing the turn-on area and turn-off point for the devices.

In regards to possible uses for the present invention, as VLSI device concentration increase, it becomes increasingly difficult to ion implant or dope just the channel areas when it is submicron in length. The present invention completely obviates the need for any special doping or implanting of the channel and thus is not an impediment to greater device concentration. A second possible use for the present invention is as a load for a driver. In the prior art, an enhancement MOSFET driver uses a depletion MOSFET load thus requiring an extra implant and mask of the depletion MOSFET whereas in the present invention both driver and load would be enhancement MOSFET devices thus simplifying fabrication. It will be appreciated that Normally-On devices such as the present invention are possibly ideal for driver loads. It will be further appreciated that because the device 5 of the present invention is always in a punch-through condition it is ideal as a load but not usable as a driver.

It will be particularly appreciated that a feature of the present invention is that it brings together the relatively new submicron VLSI technology for IC's and the relatively new in the sense of availability high resistivity technology for high voltages to take advantage of and control the observed phenonoma of a Normally-On enhancement MOSFET that may be shut off only by a negative threshold voltage.

While the above referenced embodiment of the invention has been described in considerable detail with respect to the Normally-On enhancement mode NMOS type MOSFET, it will be appreciated that other modifications and variations thereon may be made by those skilled in the art without departing from the true spirit and scope of the invention.

What is claimed is:

1. A Normally-On enhancement mode MOSFET having a gate threshold voltage for nonconduction comprising:
    a semiconductor substrate of a first conductivity type, said substrate being very lightly doped such that it has a relatively very high resistivity of at least 300 ohm centimeters,
    a heavily doped source region and a heavily doped drain region provided at a surface of said substrate, said regions being of a second conductivity type whereby source and drain junctions are provided, each of said junctions having a depletion region associated therewith due to the built-in potential of the junction, said depletion regions extending substantially into said substrate due to the very light doping of said substrate,
    and an insulated gate electrode coupled to said surface of said substrate adjacent said source and drain regions,
    said source and drain regions being separated by a substrate channel of a length not greater than about one micron whereby said depletion regions associated with said junctions overlap in said channel from source region to drain region due to the substantial extension of said depletion regions into said substrate, the electric field associated with the overlapped depletion regions being of sufficient magnitude to create an inversion layer of said second conductivity type in said channel extending from source region to drain region, said surface inversion layer providing a conduction path through said channel as between said source and drain regions such that said MOSFET is normally in the conduction mode without application of said threshold gate voltage for nonconduction to said gate electrode.

* * * * *